United States Patent [19]
Londei et al.

[11] Patent Number: 5,963,161
[45] Date of Patent: Oct. 5, 1999

[54] ITERATIVE MAPPED ANALOG-TO-DIGITAL CONVERTER

[75] Inventors: Alessandro Londei; Piero Marietti, both of Rome; Pietro Picaro, Formia, all of Italy

[73] Assignee: Universita degli Studi di Roma "La Sapienza", Rome, Italy

[21] Appl. No.: 08/909,831

[22] Filed: Aug. 12, 1997

[30] Foreign Application Priority Data

Sep. 18, 1996 [IT] Italy .................................. RM96A0640

[51] Int. Cl.⁶ ................................................ H03M 1/10
[52] U.S. Cl. .......................................... 341/163; 341/155
[58] Field of Search ...................... 341/155, 163, 341/164, 172

[56] References Cited

U.S. PATENT DOCUMENTS

| | | | |
|---|---|---|---|
| 3,815,124 | 6/1974 | Brewer | 341/141 |
| 4,185,275 | 1/1980 | Carbrey | 341/162 |
| 4,380,006 | 4/1983 | Borisov et al. | 341/118 |
| 4,667,180 | 5/1987 | Robinson | 341/136 |
| 4,691,190 | 9/1987 | Robinson | 341/122 |

*Primary Examiner*—Brian Young
*Assistant Examiner*—Peguy Jean Pierre
*Attorney, Agent, or Firm*—Young & Thompson

[57] ABSTRACT

An analog-to-digital converter based on the Bernoulli map's iterative principle, made by discrete, hybrid, mixed components, or on an integrated circuit, utilizes a single main loop circuit in which the analog signal cycles N times.

15 Claims, 7 Drawing Sheets

ITERATIVE MAPPED ANALOG-TO-DIGITAL CONVERTER

BACKGROUND OF THE INVENTION

The invention concerns the design of an Analog-to-Digital Converter based on the behavior of the iterative Bernoulli map, with possible circuit realizations either with discrete components, or with integrated circuits. The most relevant advantages in this design are the programmability of digitally converted data, namely the output binary word length, circuit simplicity, and the high speed avaliable in conversion operations.

The invention concerns analog-to-digital conversion, of electronic circuits, and can be applied to all fields in which it is necessary to convert an analog signal into suitable numeric sequences, while maintaining its correct dynamic characteristics. In particular, the invention can be used in the numerical treatment of acoustic signals, such as high-fidelity music, or ambient signals if the low-frequency range and ultrasonic signals in instrumentation at higher frequencies, and general information signals like those used in analog transmission on cables or in the air, at suitable frequencies. More precisely, the invention has an application in the manufacturing of acoustic recording systems, acoustic acquisition systems, etc. Briefly speaking, this converter can be used anywhere a numeric acquisition of any electrical signal, also a derived one, is needed, for further processing and storing.

The invention also concerns high performance A/D (Analog-to-Digital) converters, to be used in high-frequency (numerically intended) applications. This converter can be used either for civil, or for military applications.

DESCRIPTION OF THE RELATED ART

Compared to existing solutions for A/D conversion, the invention gives economical advantages. In fact, its particular circuit topology can use a very small number of elements, independently from the building of output word, as in other high-performance converters. Furthermore, the circuit has been designed in a way that minimizes the number of complex analog electronic elements (such as operational amplifiers), with the use of CMOS (Complementary Metal Oxide Semiconductor) and of Schottky TTL (Transistor Transistor Logic) logical gates, both in the control and sinchronization part of the circuit, and in the high-frequency (numerical), special operation, typical in the analog world (analog comparison). These kind of components provides very fast circuit operation. The integrated version of the circuit can reach conversion frequencies of about 600 kWords/sec, for 12-bit words. The circuit can be realized in a variety of ways, for example in a fully parallel version that reaches frequencies of 1 Mword/sec, for 12-bit words. Another very important element is the circuit topology's flexibility. The circuit, in fact, can be programmed in such a way as to define the output numerical word length without having electronic variation in the system, and it's also possible to introduce a special kind of internal parallelism, if the simple-mode available speed doesn't match the user's needs.

The invention utilizes the dynamic characteristics of a mathematical operator, named the Bernoulli Map. The theoretical principle from which the invention has been extracted is described in the following lines. Consider an analog voltage $V_i$, ranging from 0 V to a reference voltage $V_R$. It is possible to give a numerical representation, as a binary number, of the ratio $$x_0 = \frac{V_i}{V_R}.$$

This quantity belongs to the real numbers' class, and, generally speaking, will be described by an infinite sequence of binary digits (bits). To realize an n-bit A/D conversion of the input analog voltage, means to extract the first most significative n digits from $x_0$, performing, in such way, a truncation of the initial number. The Bernoulli map is a recursive operator $M:[0,1] \to [0,1]$, defined by the relation $x_{n+1} = M(x_n) = 2x_n \pmod{1}$. That is, a number $x_n$ in the range from 0 to 1 is doubled and, if its value is greater than one, 1 is subtracted from it (see FIG. 1). If one associates binary value 0 to the interval $[0, 0.5)$, and binary value 1 to the interval $[0.5, 1]$, every iteration of the M operator produces a binary output that corresponds to the similar digit in the numerical representation of $x_0$. If we execute this recursive operation for m-1 times, it is possible to collect the m output bit, in such a way as to form the numerical word associated with the analog value to convert.

To the inventors' knowledge, no circuit solution based on the principle is known, but A/D converters based on different principles are presented in the specific literature. However, the functional performance of these are below those of the present invention. Faster converters are presented in the specific literature, but the circuit complexity they required is greater than that of the present invention. For example, the Flash Converter known for its high conversion speed; to perform an n-bit conversion, requires $2^n$ very high precision resistors, $2^n-1$ analog comparators, $2^n-1$ Edge Triggered flip-flop, and a logic combinatorial network with a number of logic gates, normally in ECL technology, so as not to damage the conveter performances, linearly depending on $2^n$.

SUMMARY OF THE INVENTION

The converter of the present invention generally requires the use of: three operational amplifiers, eight CMOS inverters, thirteen CMOS technology "transmission gates", one type-D flip-flop. The converter also uses a number of linear components, such as resistors and capacitors, less than ten, and a digital network of limited synchronization and storing, not needed by the current topology, for in it the synchronization operations can be limited to few elements and the storing can be a user-made task, giving a digital serial output.

The converter operates by successive approximations. The invention takes a series of successive decisions capable of evaluating, each time, if an analog signal, generated by the original voltage, is greater or lower than the threshold voltage located at the middle of the dynamic range. The great advantage, as to the successive approximations' converter, is in the fact that, to compare the iterate signal to the threshold, the circuit does not require any analog-to-digital converter, and therefore the invention reduces circuit complexity.

Furthermore, unlike prior art converters, the output word length does not depend from the circuit structure, but can be programmed by the user in the range limited by conversion errors.

The invention is described in the following, as to the inventors' actually preferred embodiments, and on the basis of the included design tables.

BRIEF DESCRIPTION OF THE DRAWINGS

A brief description of the drawing figures follows.

DESCRIPTION OF THE PREFERRED EMBODIMENT

Figure 1:
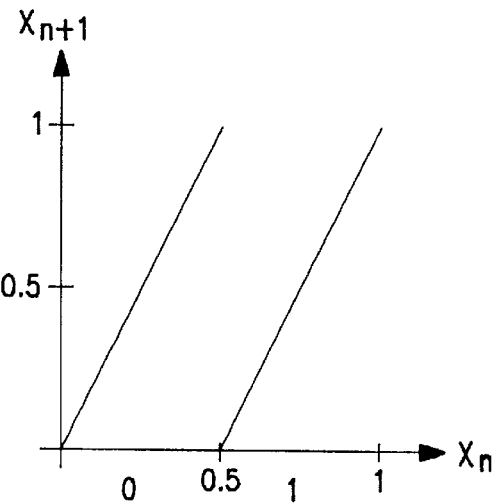
FIG. 1—Diagram of the Bernoulli iterative map
Figure 2:
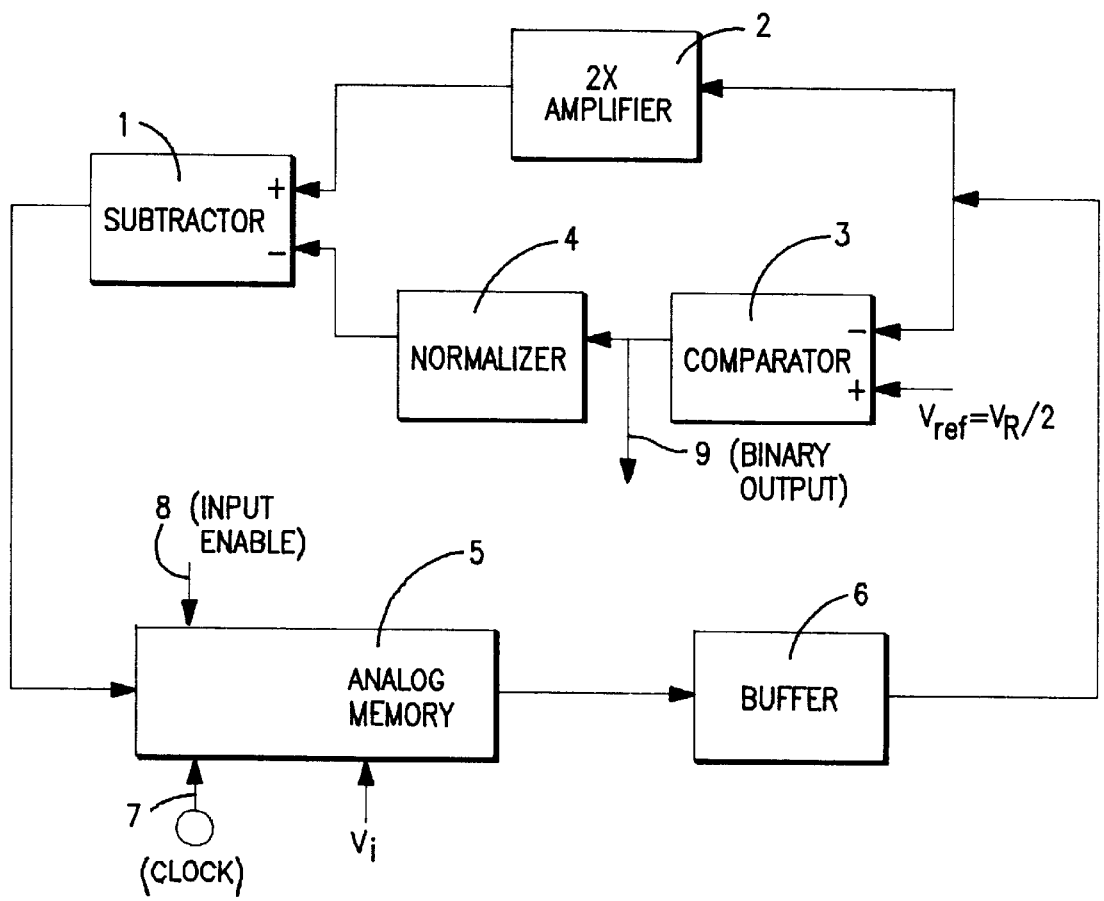
FIG. 2—Schematic representation of the analog-to-digital converter

With reference to FIG. 2, the invention is, comprises
1 subtractor circuit,
2 amplifier by a factor of 2,
3 comparator circuit,
4 normalization block,
5 analog memory,
6 buffer,
7 clock,
$V_i$ input voltage,
$V_{ref}=V_R/2$ reference voltage, equal to half of the input dynamic range,
8 input enable,
9 binary output, and
10 logical network.

Figure 4:
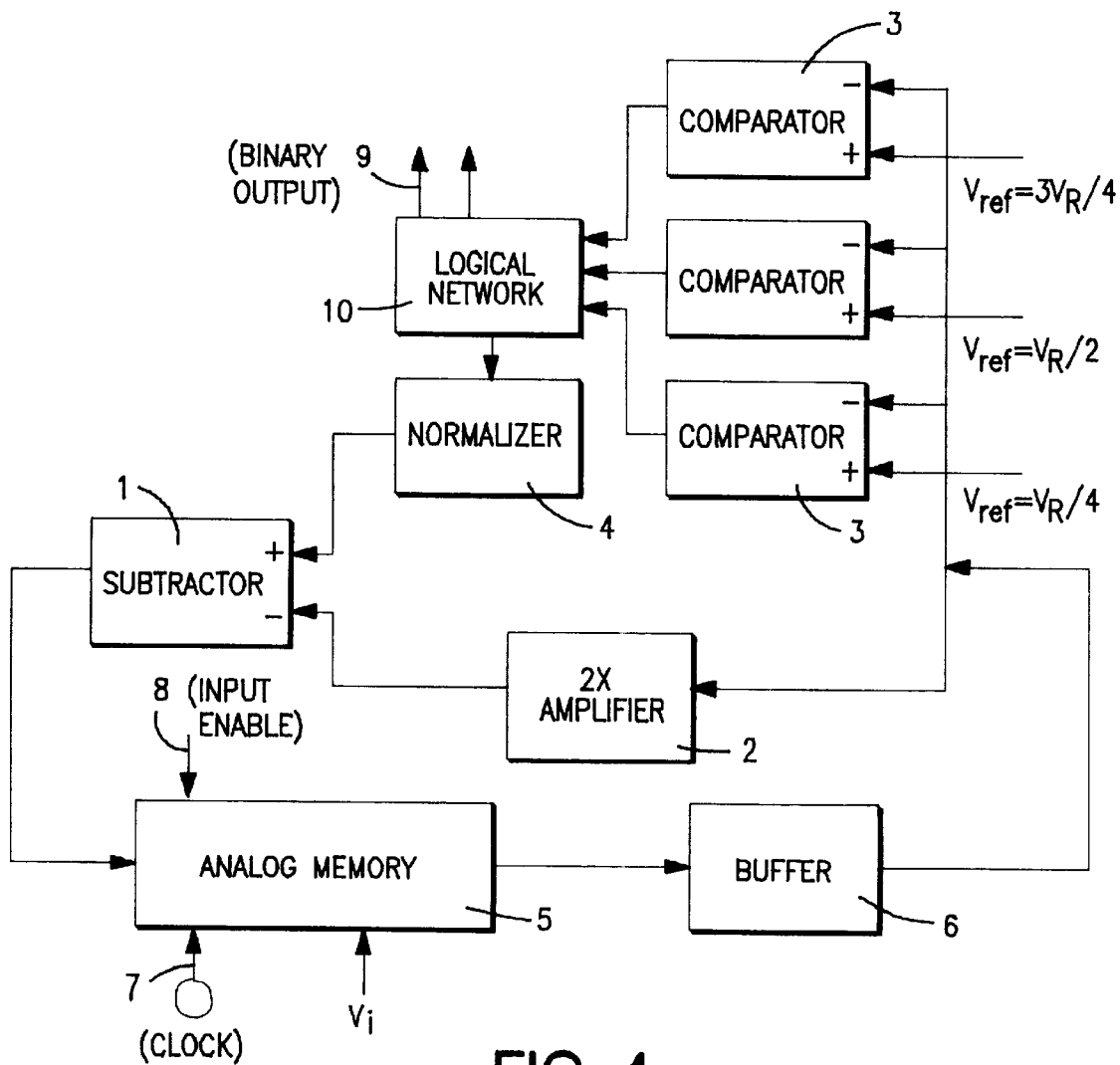
FIG. 4—Schematic representation of the parallelized converter

With reference to FIG. 4, the converter, in a parallelized embodiment, has some further functional elements. These elements, numerically increased in geometrical progression, make the device progressively faster. This fact must be regarded as an important aspect of the invention referred to in this patent file.

Figure 5:
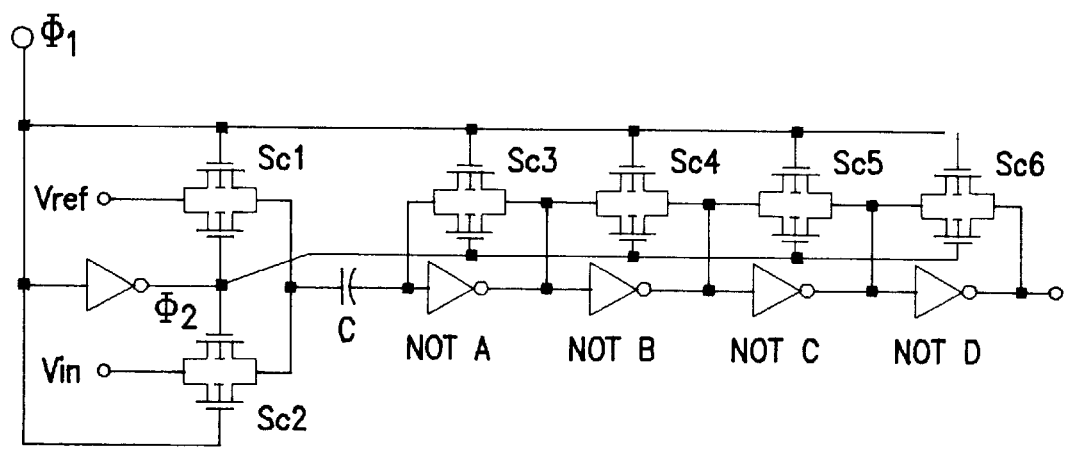
FIG. 5—Electric diagram of a comparator circuit

The comparator circuit 3 includes five CMOS inverters, six transmission gates, a capacitor and a synchronization signal, as shown in FIG. 5. In the high phase of $\Phi_1$ the four inverters A, B, C, D have a short circuit connession between input and output and a synchronization signal and, for which reason, the voltage on the negative terminal of the capacitor has the value $V_{th}$, (that is the mean value of the voltage in the CMOS characteristic curve). At the same time, due to the closure of switch Sc1, the $V_{ref}$ voltage is applied on the positive terminal of capacitor C. In the low phase of $\Phi_1$, corresponding to the high phase of $\Phi_2$, the $V_{in}$ voltage unbalances the condenser voltage, due to the difference between $V_{in}$ and $V_{ref}$. If $V_{in}<V_{ref}$, the voltage on the negative terminal of capacitor C comes down, bringing rapidly the comparator 3 output to the logic value 1, while on the contrary, output goes to the logic value 0. An advantage in using this topology is that no offset voltage is present, and the error on the comparator trigger threshold is only a few microvolts. Previously, these performances would be degraded by a factor between 100 and 1000. At the end of the inverter chain, a latch has been inserted (see FIG. 8), with a memory function for showing and mantaining a stable comparison logic state, to allow the subtractor to read data from the comparator.

Figure 6:
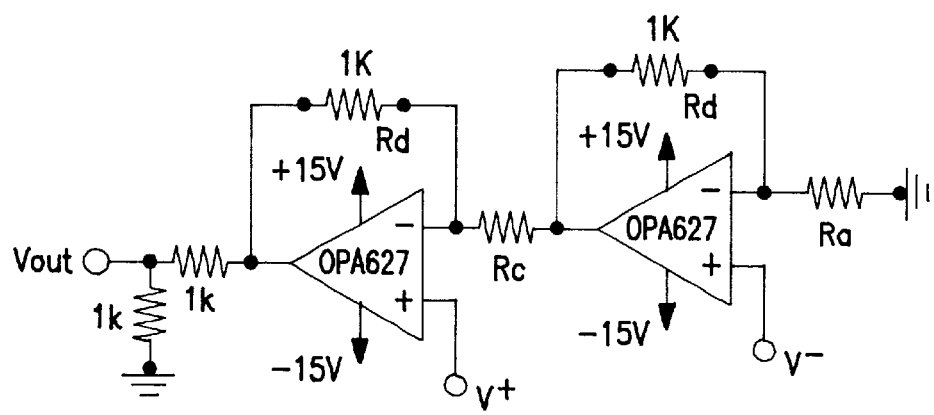
FIG. 6—Electric diagram of a subtractor circuit

With reference to FIG. 6, the subtractor 1 comprises two high precision operational amplifiers of the instrumentation type. This topology allows for an accurate evaluation of difference between the input voltages and, choosing the resistance network in a proper way, allows for a differentiated amplification of the two inputs, making thus the presence of the 2-times amplifier 2 unnecessary.

Figure 7:
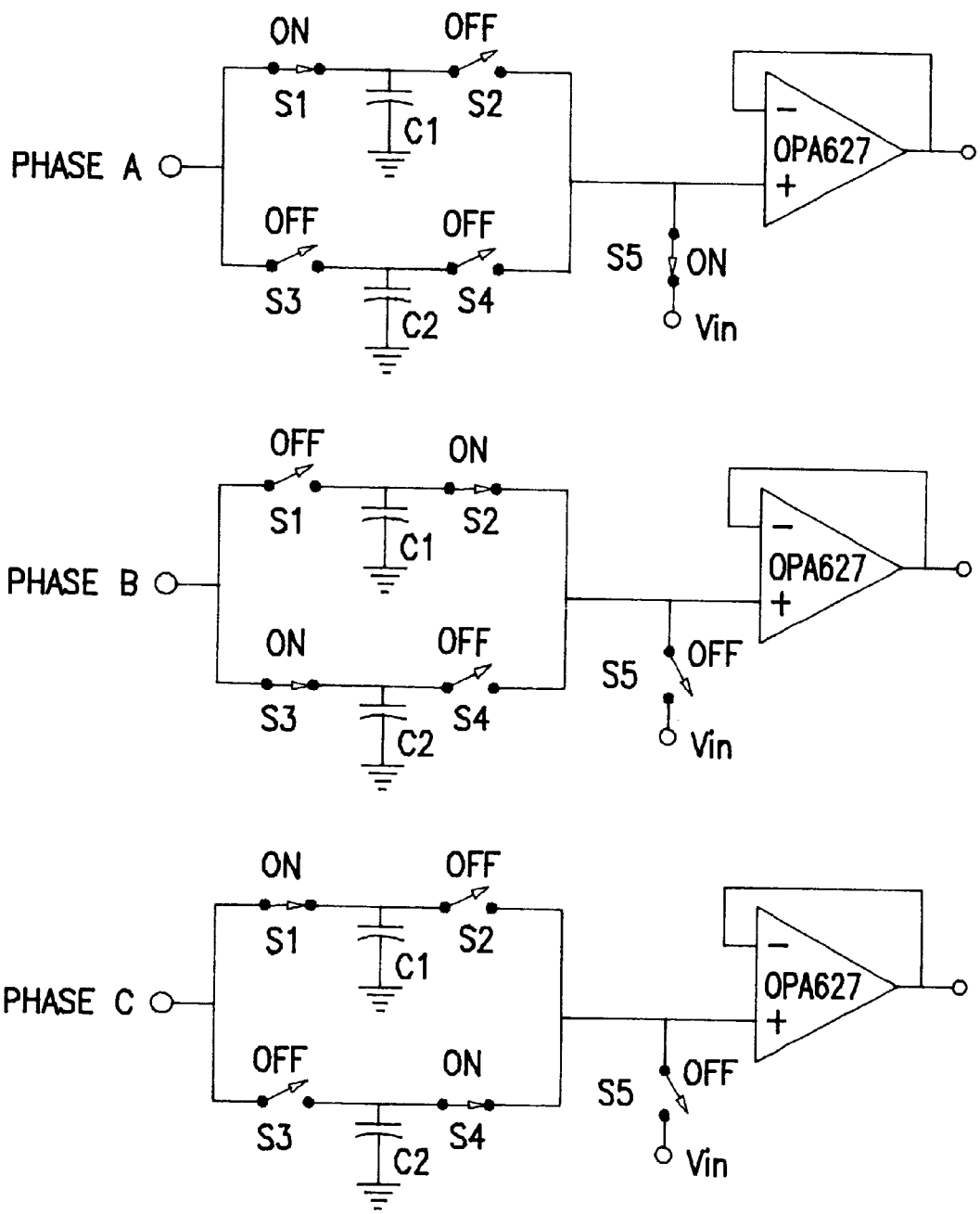
FIG. 7—Analog memory

The topology of analog memory 5 is presented in FIG. 7, in which the main three phases of operation A, B, C have been emphasized. The five switches S1, . . . , S5 provide a transmission gate. In Phase A initially, the voltage to be converted enters the buffer and, at the end of the first iteration, the data is stored in the C1 capacitor. Both capacitors are excluded from reading buffer 6. In Phase B, the input is excluded until the new conversion takes place and the data in C1 is presented at the buffer input. After an iteration, the new data will be stored in the C2 capacitor. In Phase C the data in C2 is presented at the buffer input. After an iteration, the new data is contained in the C1 capacitor. The whole block is synchronized by a proper logic signal, to open and close the switches.

In FIGS. 2 and 4, not all the analog and digital controls necessary to the circuit to execute the conversion function, are shown. These controls are, however, summarized as follows.

Reference voltage $V_{ref}$: may be generated by a stabilized voltage generator. In the parallelized version of the circuit (FIG. 4), due to its needing to have two or three reference voltages, these can be generated by a resistive partition of the generator, or by a corresponding number of generators. This voltage can be considered also as an eventual global circuit input.

A supply voltage is needed to supply the control logic and the sequential network (counters, latch). It is a circuit external parameter.

Clock generator synchronize the operations in the converter. It can be an external circuit parameter.

Programmable counters to determine the output bit-word length.

A serial-parallel register collects serially emitted bits from the circuit and provides them at the end of the parallel output (word) conversion.

A combinatory network it is necessary to handle control signals enabling the various circuit elements. In the parallelized version of the converter, this network handles the output decoding of the k bits generated every iteration.

One-shot sequential elements: generate digital signals with a length less than a clock period, necessary to enable the sampling operation of the Sample and Hold circuit, to allow reading of the data by the latch (LE), and to reset counters before the start of any conversion.

The Sample and Hold circuit serve to ensure a constant value during the sampled input voltage reading. It is not necessary to be a circuit part. It can be also an external parameter.

Figure 8A:
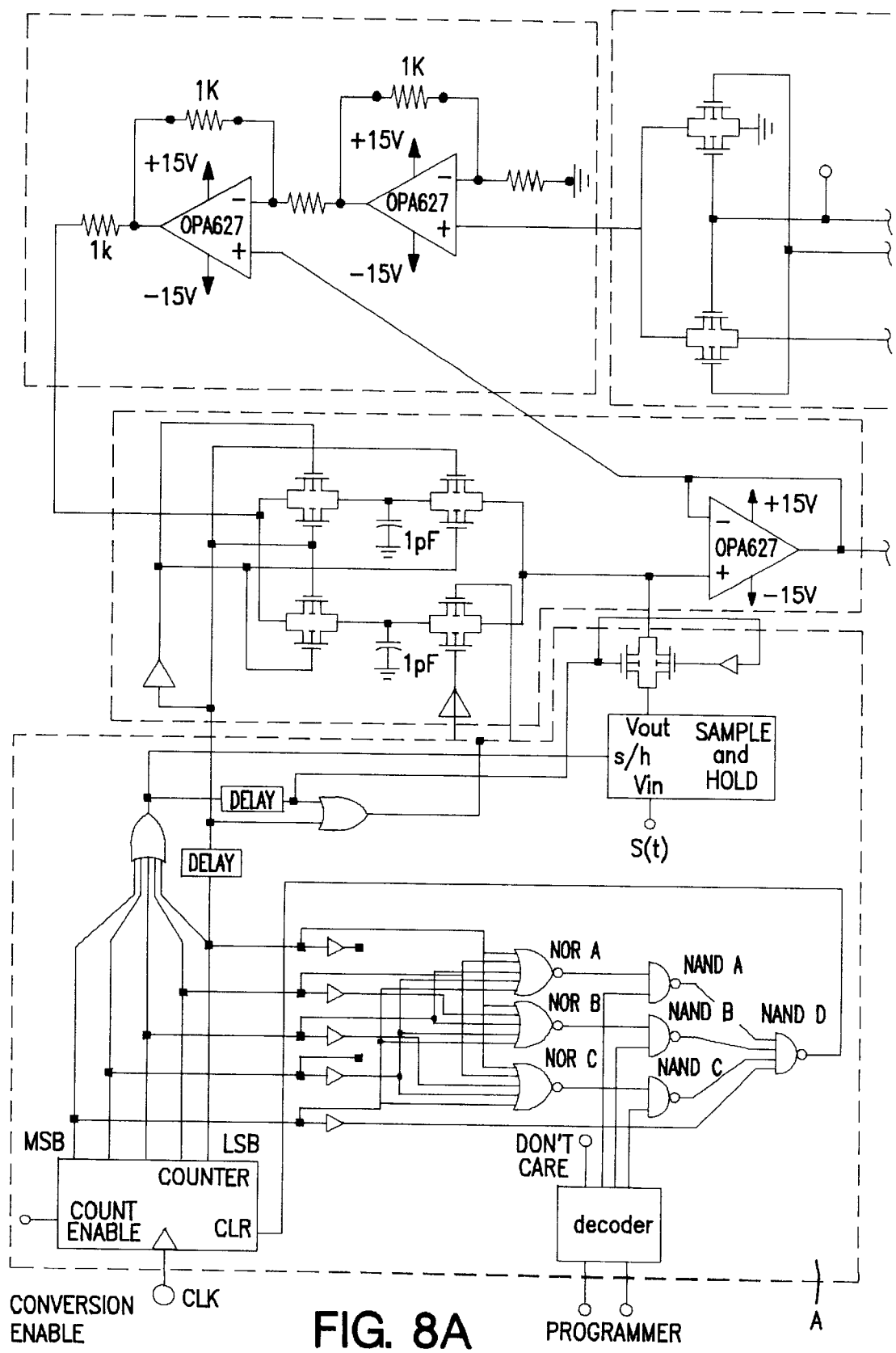
FIG. 8—Schematic representation of the circuit, completed with all its analog and digital parts (this is a union of FIGS. 5, 6 and 7, seen as a whole).
Figure 8B:
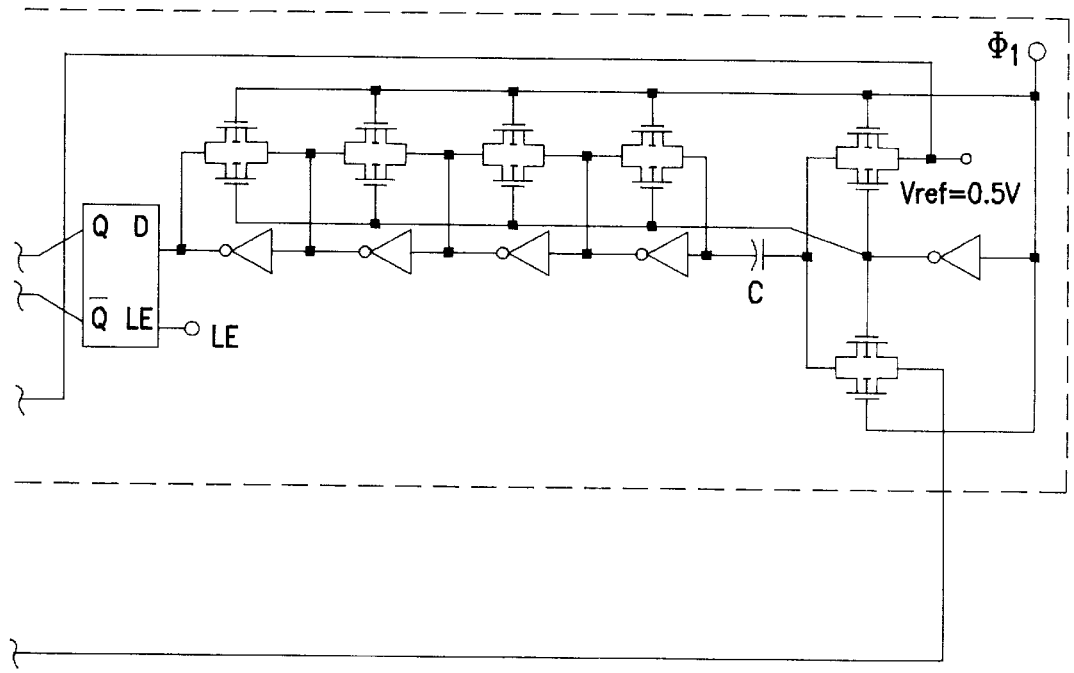
Figure 9:
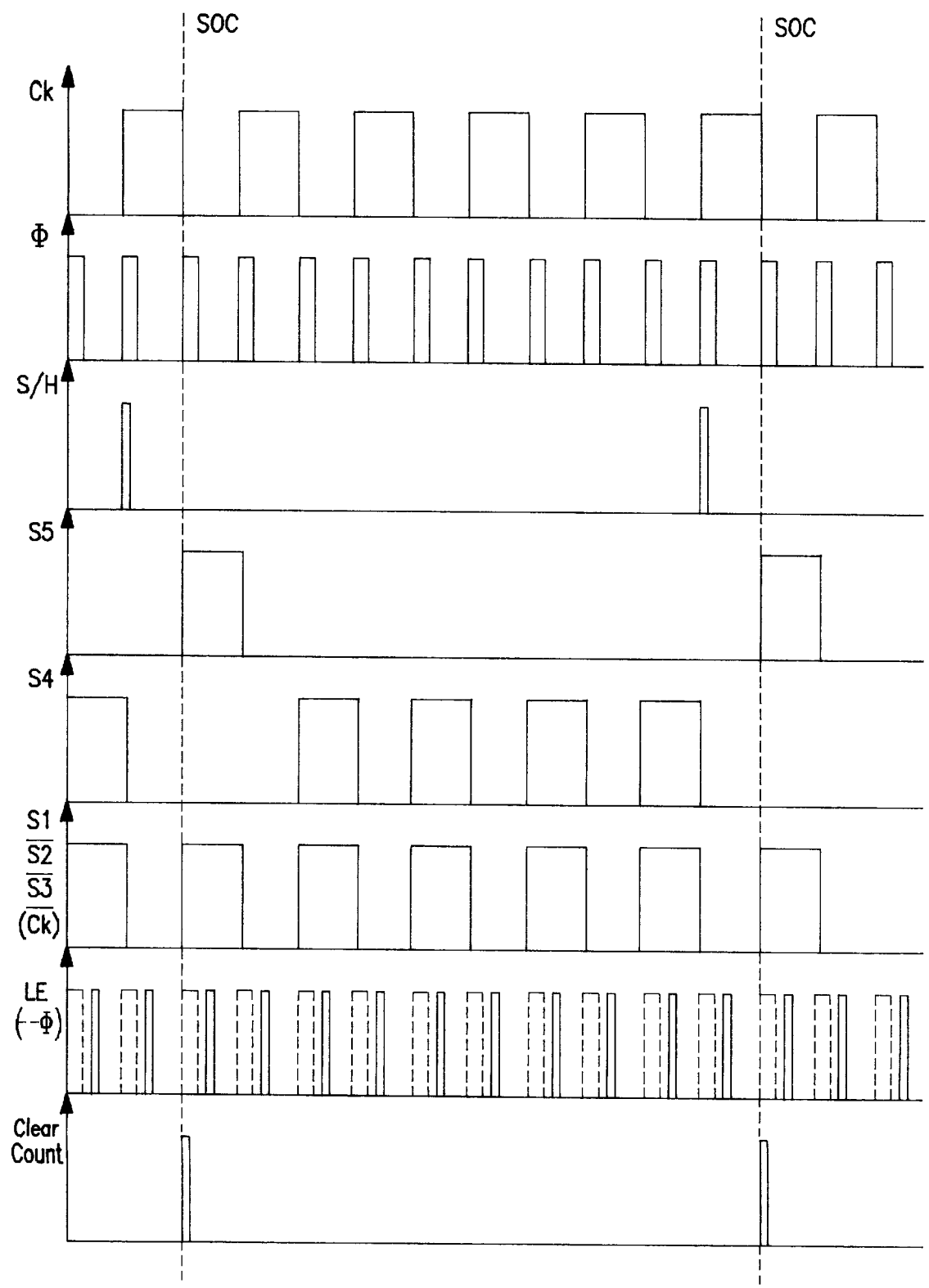
FIG. 9—Schematic representation of the synchronization signals.

FIG. 8 shows the complete circuit in the analog and digital parts. The circuit shows the electrical diagrams of the just mentioned blocks, together with the output word length control, realized by a numerical counter with a programmed reset (FIGS. 5, 6 and 7, drawn in a whole, and block A). FIG. 9 shows synchronization signals.

FIG. 9 shows the following. A clock synchronizes the whole circuit. The clock may be generated internally to the device, or can be considered as an external parameter. Each data iteration occurs every half period (FIG. 9 shows a 10-bit conversion, for 5 clock periods in total). The conversion operation starts at the first negative edge of the clock signal. All the other signals are generated from this signal.

$\Phi$ is needed by the comparison operation. In its active state, the reference voltage is read from the C capacitor, through the closure of the corresponding switch. In the low phase, the decision on the data amplitude takes place with the closure of the opposite switch. The entire operation takes place into a clock semiperiod, and therefore this signal must be generated by a one-shot element.

S/H enables the reading of the voltage to be converted by the Sample and Hold. This operation can happen during the last clock semiperiod of the previous conversion without degradation of the circuit performance. The time duration of this signal must allow a proper reading of data. Therefore it is generated by a one-shot element.

S5 enables the closure of the fifth switch, present in the analog memory, allowing the Sample and Hold output voltage reading by the buffer. Its active phase has a duration of a clock semiperiod, but happens only at the start of conversion. It is generated by the clock through the combinatorial network.

S4 enables the closure of the fourth switch present in the analog memory. Together with S5, it forms the negated clock signal.

S1 enables the closure of the first and the opening of the second and third switches, present on the analog memory. It equals the negated clock signal.

LE enables the reading of the comparison state by the latch. It becomes active, within a certain delay, immediately after the negative edge of the signal $\Phi$ (shown, dashed, in FIG. 9), to ensure a stable reading of the state. It is generated by a one-shot element.

Clr count enters zero into the counters at conversion' start, and it is generated by a one-shot element.

A description of the converter operation follows.

FIG. 2 shows, as previously mentioned, the functional blocks which realize the iterative functions.

When the stable analog data, present at the input, has been read, it is sent through buffer 6 to doubling amplifier 2, designed in such a way to double that signal. If, however, the initial voltage which result would be greater than the threshold voltage, equal to $V_R/2$, the quantity to iterated must be decreased exactly of the value $V_R/2$. This operation is peformed by the comparator 3, by the normalization block 1 and by the subtractor 1. The normmalization block 4 becomes necessary to adapt output voltage levels of the comparator 3 at the exact quantity to subtract from the data. Finally, the voltage obtained is sent to analog memory 5 stores the data and makes it ready for the next iteration. This block must be realized in such a way as that, at the conversion procedure start, it has on its output exactly the value to be converted while on the next steps, the iterate value itself is the value provided to the buffer 6. If one realizes, in such a way, the requested number of iterations, it is possible to read on the binary output the serial bit sequence which represents the initial value $V_i$.

Figure 3:
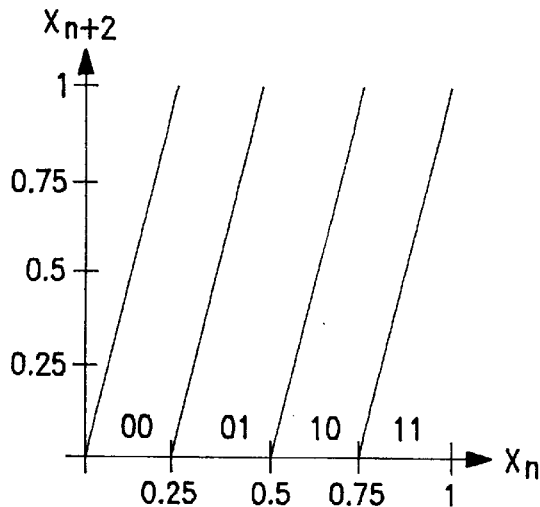
FIG. 3—Diagram of the Bernoulli map, after the first iteration

An alternative topology to the FIG. 2, that is capable of progressively parallelizing the iterative functions, uses the iterative maps' property which states that $x_{n+2}=M(M(x_n))=M^2(x_n)$, and, more generally, $x_{n+k}=M^k(x_n)$. Using these kind of operators, it is possible to realize a circuit from which k bits are emitted in each iteration. It is clear that, when k increases, the number of components that are necessary to realize the circuit increases in such a way as $2^k$. Therefore, if m is the number of bits that are necessary to make the conversion, to realize an highly parallel circuit with k=m, the system's final complexity would be equal to the complexity of the Flash converter, and the two topologies would be practically the same. In the case in which k=2, increases in the conversion speed up to the double of the base circuit's value can be obtained. Graphically, the iterative map is shown in FIG. 3, and the block diagram of the parallelized system is shown in FIG. 4.

We claim:

1. A programmable analog-to-digital converter utilizing Bernoulli map's iterative principle comprising:
    a main loop circuit comprising
    an analog memory whose output is connected to a buffer,
    an output of said buffer being connected to a factor-2 amplifier input and a comparator input,
    said factor-2 amplifier being connected in parallel with said comparator and a normalization element,
    an output of said comparator being provided as an input to said normalization element,
    said factor-2 amplifier and said normalization element each providing an input to a subtractor, said subtractor including an input to said analog memory;
    an input enable line and an input voltage signal line connected to said analog memory;
    a binary serial output line provided by said comparator,
    wherein an analog signal to be converted to a digital signal is inputted on said input voltage signal line and said main loop circuit cycles the analog signal to provide an N bit output at said binary serial output line.

2. The converter of claim 1, wherein said comparator further comprises five inverters and six transmission gates, four of said inverters connected in series with one another, one of said transmission gates connected in parallel with each of said four series-connected inverters, the fifth of said inverters being connected to the remaining two transmission gates, one of said remaining two transmission gates being provided with an input from said buffer output, the other of said remaining two transmission gates being provided with a reference voltage, each of said remaining two transmission gates further comprising a synchronization signal input and an output connected, via a capacitor, to an input of said four series-connected inverters.

3. The converter of claim 2, wherein said factor-2 amplifier and said subtractor further comprise a first operational amplifier having an input connected to said normalization element, an output of said first operational amplifier being connected to an input of a second operational amplifier, said second operational amplifier having an input connected to said buffer output.

4. The converter of claim 1, wherein said analog memory further comprises an input accepting said subtractor output, first and second switches connected on first sides to said analog memory input accepting said subtractor output and connected on second sides to first and second capacitors respectively, third and fourth switches connected on first sides to said second sides of said first and second switches, second sides of said third and fourth switches connected together and to a fifth switch, said fifth switch also being connected to said analog voltage input line.

5. The convertor of claim 4, further comprising a programmable means for moving data across said buffer in a three phase cycle.

6. The converter of claim 1, further comprising a reference voltage generator with an output equal to half of an input dynamic range.

7. The converter of claim 1, wherein said comparator comprises plural comparators connected in parallel, each of said parallel plural comparators being connected to said buffer output and to a different reference voltage.

8. The converter of claim 7, wherein said comparator further comprises a logical network for output data encoding, said logical network providing said comparator output to said normalization element input.

9. The converter of claim 7, further comprising a reference voltage generator with plural differing outputs connected to said parallel plural comparators.

10. The converter of claim 9, wherein said parallel plural comparators number three and said plural differing outputs comprise a first voltage, a second voltage equal to twice said first voltage, and a third voltage equal to three times said first voltage.

11. The converter of claim 10, wherein said voltage generator further comprises a partitioned resistive circuit.

12. The converter of claim 1, wherein said analog memory further comprises a clock input.

13. The convertor of claim 12, further comprising a clock generator whose output is connected to said analog memory clock input.

14. The convertor of claim 1, wherein said buffer further comprises an operational amplifier.

15. The convertor of claim 1, wherein said N bit output is a positional binary number.

* * * * *